United States Patent
Dussaliyev et al.

(10) Patent No.: US 11,581,466 B2
(45) Date of Patent: Feb. 14, 2023

(54) THERMOELECTRIC GENERATOR

(71) Applicant: Kairgali Dussaliyev, Almaty (KZ)

(72) Inventors: Kairgali Dussaliyev, Almaty (KZ); Nurlan Dussali, Kaarst (DE)

( * ) Notice: Subject to any disclaimer, the term of this patent is extended or adjusted under 35 U.S.C. 154(b) by 0 days.

(21) Appl. No.: 17/628,343

(22) PCT Filed: Jun. 10, 2020

(86) PCT No.: PCT/IB2020/000574
§ 371 (c)(1),
(2) Date: Jan. 19, 2022

(87) PCT Pub. No.: WO2021/014205
PCT Pub. Date: Jan. 28, 2021

(65) Prior Publication Data
US 2022/0263006 A1 Aug. 18, 2022

(51) Int. Cl.
*H01L 35/32* (2006.01)
*F24S 23/71* (2018.01)
*F24S 20/00* (2018.01)

(52) U.S. Cl.
CPC .............. *H01L 35/32* (2013.01); *F24S 20/00* (2018.05); *F24S 23/71* (2018.05)

(58) Field of Classification Search
None
See application file for complete search history.

(56) References Cited

U.S. PATENT DOCUMENTS

2011/0226301 A1   9/2011   Kershaw

FOREIGN PATENT DOCUMENTS

DE     102019007785 A1    1/2021

OTHER PUBLICATIONS

Russia International Searching Authority Report (ISA) regarding PCT/IB2020/000574; 4 pages.

*Primary Examiner* — Eli S Mekhlin
(74) *Attorney, Agent, or Firm* — Emerson Thomson Bennett; Daniel A. Thomson

(57) ABSTRACT

A thermoelectric generator consists of circuits arranged in parallel rows, in which thermocouples in adjacent rows are facing each other by the same-named junctions, forming alternating narrow zones of hot and cold junctions. At least one of the layers is a layer of thermal energy thermocouples, the repeatability of the rows of circuits of which is two times less than the repeatability of the rows of circuits of thermocouples generating electricity. Hot and cold zones between the rows of thermocouple circuits of all layers of thermocouples generating electricity and hot and cold junctions of the rows of thermocouple circuits of thermal energy are superimposed, respectively, by tight contact on each other by junctions and substrates, ensuring internal heat exchange between them. In addition, the generator is provided with an external heat supply circuit to the hot zone area and a heat removal circuit from the cold zone area.

18 Claims, 2 Drawing Sheets

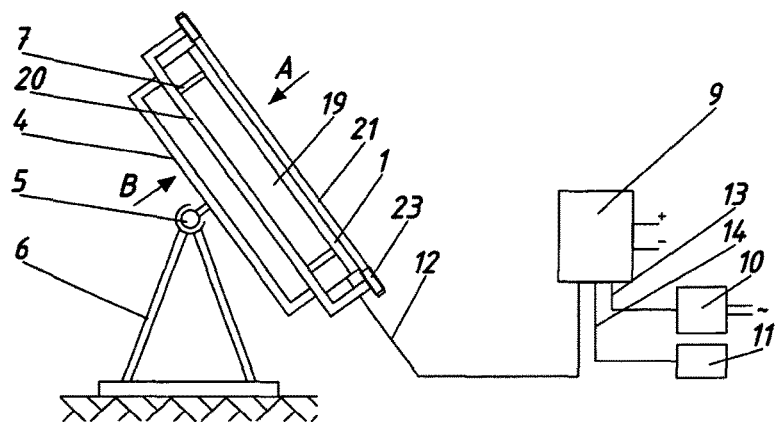
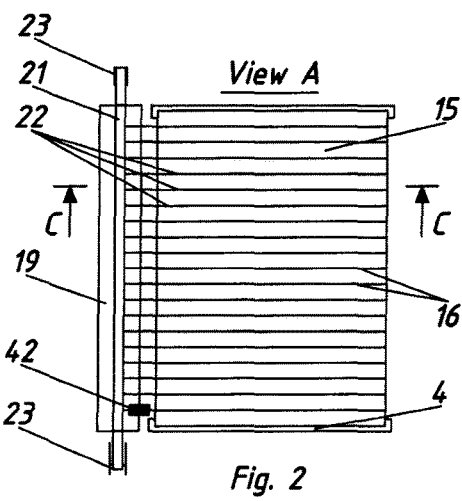
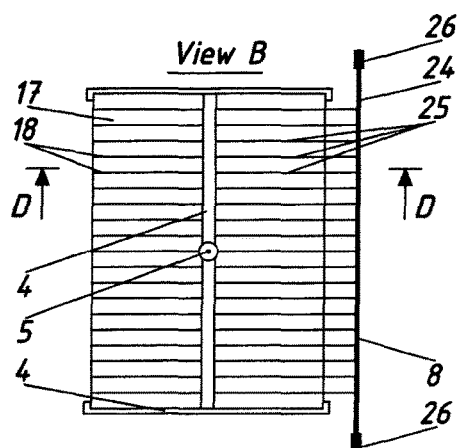
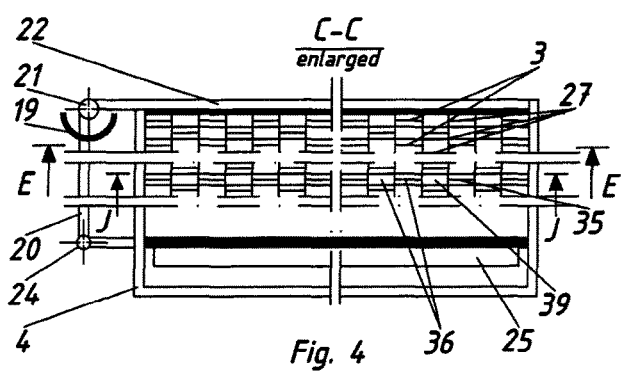
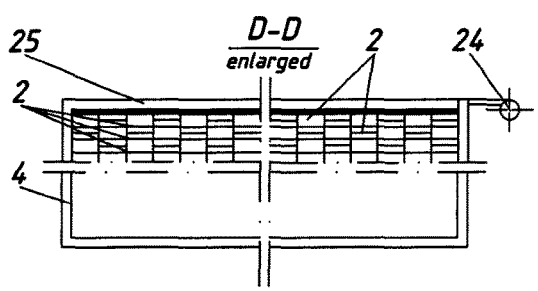

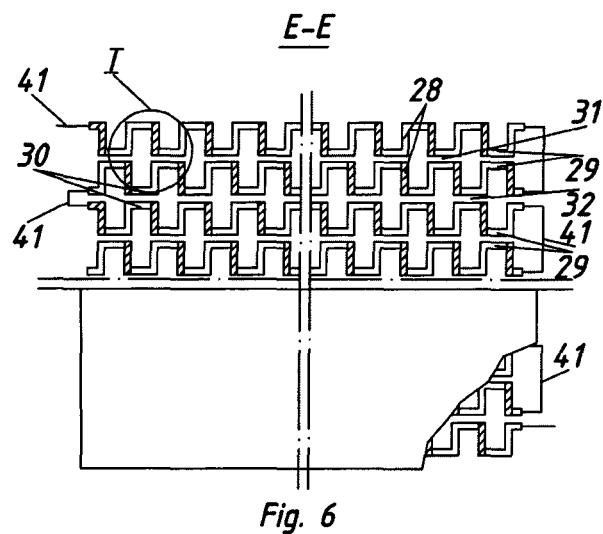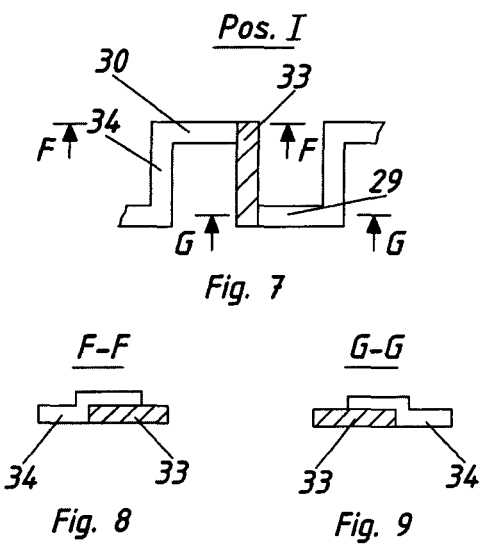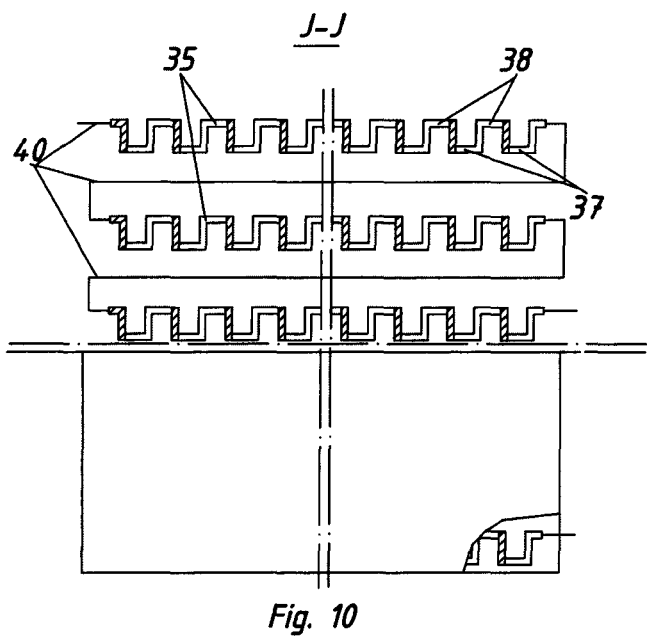

THERMOELECTRIC GENERATOR

The invention can be used as an autonomous source of electricity in various fields: automotive (electric cars), energy (small industries, agricultural farms, households), refrigeration (stationary and portable devices), electronic (mobile devices and gadgets), oil and gas (electrochemical protection stations for main pipelines), space (flying orbiting artificial objects), sea (additional energy sources for submarines), etc.

Known thermoelectric generator (TEG) with thin-film elements p- and n-type located between warm and cold temperature sources (patent RU 2113035).

The disadvantage of TEG is that the implementation of the thermocouple layer is possible only as a single-layer due to heat transfer in the direction perpendicular to the plane of the layer. The temperature difference is insignificant, which means that the generated thermo-electromotive force is small and the efficiency of the TEG is low.

Known thermoelectric converter (patent RU 2604180), containing thermoelectric cells with series-connected film thermoelectric legs, which are made of semiconductor materials and located between heat exchange layers. The space between the heat exchange layers and thermoelectric legs is filled with an insulator.

The disadvantage of the technical solution is a single-layer implementation of the converter. Implementation of the converter based on this solution as multilayer is difficult, since heat transfer occurs between the thermocouple junctions, which are separated by an insulator. Heat transfer in a multilayer arrangement does not allow a high temperature gradient to be obtained. Therefore, the efficiency of the thermoelectric module is low.

Known thermoelectric module (patent RU 2611562) composed of semiconductor elements p- and n-type of conductivity, which are connected in an electrical circuit in series in alternating order. In this case, contacts from thermoelements of p- and n-type are made on different sides of the dielectric substrate, and the thermocouple legs are applied to the substrate by screen printing.

The disadvantage of the thermoelectric module is that with such an arrangement of the thermocouple junctions, it is difficult to make and superimpose other thermocouple layers and the possibility of heat transfer between the layers. The efficiency of the module is low due to the insignificant generation of thermo-electromotive force on each layer of thermocouples.

Known technical solution—thermoelectric battery (patent RU 2269183). The battery consists of alternating legs made of semiconductor p- and n-type, connected in series in an electric circuit. The electrical connection of the legs junctions is carried out with the help of connecting plates. The battery thermocouples are placed in one layer. The thermoelectric battery can operate in the mode of generating thermal energy or in the mode of generating electricity.

The disadvantage of this solution is that heat transfer is carried out efficiently through one layer of thermocouples. With multilayer design, the temperature difference between the junctions is negligible and the battery efficiency is low.

The closest in technical essence is the invention of a thermoelectric converter (patent RU 2131156). The thermoelectric converter contains a battery formed by series-connected thermocouples. Each thermocouple is made as a three-layer panel with superimposed layers, hot junction, legs and cold junction. The junctions are located over the entire surface of a pair of legs and are separated from each other by a dielectric insert. The cold junction of each thermocouple is split in two by a dielectric insert. Thermocouples are formed in the form of a multilayer structure, containing superimposed with offset parallel connected three-layer panels of series-connected thermocouples. The three-layer panel is formed by successive deposition or electrolysis of layers.

The disadvantage of the known solution is the very small temperature difference between the thermocouple junctions in each three-layer panel when they are superimposed on each other due to the transfer of heat in the thermocouples through the three layers. This temperature difference will be in the limit of fractions of degrees Celsius. The thermoelectromotive force generated by each thermocouple is low. The operation of the converter depends on the presence of a heat source and weather conditions; therefore, the efficiency of the thermoelectric converter is low.

The technical result achieved by the invention is to increase the efficiency and reliability of the TEG. The result is achieved by the fact that a thermoelectric generator containing a stack of superimposed thin-film (multistage) layers, on each of which flat thermocouples that generate electricity connected in series in electric circuits are arranged in parallel rows, is equipped with at least one layer of thermocouples of thermal energy, the repeatability of the rows of circuits of which is two times less than the repeatability of the rows of circuits of thermocouple generating electricity, made on a dielectric heat-conducting substrate and placed between layers of thermocouples generating electricity, each layer of which is made on the same substrate. The same-named junctions of circuits of the thermocouple generating electricity from adjacent rows are faced each other on each layer and alternating rows of narrow zones of hot and cold junctions of thermocouples are formed between them, and a layer of thermocouples of thermal energy is connected to an external current source. Hot and cold zones between the rows of circuits of thermocouple of all layers of thermocouples generating electricity and hot and cold junctions of the rows of circuits of thermocouple of thermal energy are superimposed, respectively, by tight contact on each other by junctions and substrates, ensuring internal heat exchange between them. In addition, the generator is provided with external heat supply and heat removal circuits, the body of which is rigidly connected to the stack's frame. The heat supply circuit, installed along one side of the frame, is composed of a solar collector in the form of a parabolic mirror tray that concentrates sunlight, and a metal receiver located along the focal line of the collector, movably attached to the collector body and connected with metal strips parallel to each other in one plane capable of contacting the external substrate of the generator that protects the upper layer of thermocouples. The heat removal circuit is made in the form of thin metal ribs parallel to each other in one plane on a longitudinal rod, which is located along the side of the frame and is movably attached to the collector body, having the ability to contact the outer substrate of the lower layer of thermocouples. Parallel strips and ribs are applied, respectively, on the outer upper and outer lower substrates along the entire length of the row, respectively, in the area of hot and cold zones of thermocouples generating electricity.

The essence of the TEG invention is illustrated by drawings, where

FIG. 1 shows the TEG diagram from the side;
FIG. 2 is a view according to A FIG. 1;
FIG. 3 is a view from B FIG.1;
FIG. 4 is a cross-section along C-C of view A FIG. 2;
FIG. 5 is a cross-section D-D of view B FIG. 3;

FIG. 6 is a longitudinal section along E-E FIG. 4; in FIG. 7 position I FIG. 6;
FIG. 8 is a cross-section along F-F FIG. 7;
FIG. 9 is a cross section along G-G FIG. 7;
FIG. 10 is a longitudinal section along J-J FIG. 4.

The TEG contains a stack 1 superimposed on each other (multistage) layers 2 of thermocouples generating electricity 3, a frame 4 fixed on the hinge 5 of the support 6, a heat supply circuit 7, which is installed along the longitudinal side of the stack 1, and heat removal circuit 8, a control and distribution unit 9, inverter 10 and storage batteries 11 (FIG. 1). The control and distribution unit 9 is connected by cables 12, 13 and 14, respectively, to layers 2 of the stack 1, the inverter 10 and the storage batteries 11. The stack 1 is closed from the upper outer side with a strong dielectric material 15 with parallel slots 16 and from the lower outer side—the same material 17 with parallel slots 18 (FIG. 2, 3).

The heat supply circuit 7 includes a solar collector 19, made in the form of a parabolic mirror tray, which is installed in the body 20, and a metal receiver 21 with strips 22 parallel to each other in one plane, attached by movable axes 23 to the body 20 (FIG. 1, 2, 4). The body 20 is rigidly fixed to the frame 4. The heat removal circuit 8 has a longitudinal rod 24 with thin ribs 25 parallel to each other in one plane. Rod 24 is attached by movable axes 26 to the body 20 (FIG. 3,4, 5).

Each layer 2 of thermocouples generating electricity 3 is made on a thin dielectric heat-conducting substrate 27 (FIG. 4,5). The same substrate is applied to the top layer of thermocouples to protect them. Circuits 28 of thermocouples on each layer 2 face each other by hot junctions 29 or cold junctions 30, forming alternating rows of narrow hot 31 and cold 32 zones (FIG. 6). Thermocouples generating electricity 3 are made of dissimilar metals 33 and 34 and their junctions 29 and 30 are overlapped on the substrate 27 (FIG. 7,8,9).

Consecutively connected circuits 35 of thermocouples of thermal energy 36, consisting of hot 37 and cold 38 junctions, form alternating rows on layers 39, which are placed between layers 2 of thermocouples generating electricity 3 (FIG. 10). The repeatability of alternating rows of circuits 35 of thermocouples 36 is half the repeatability of alternating rows of circuits 28 of thermocouples 3. Circuits 35 of thermocouples of thermal energy 36 can also be connected in series, parallel or combined. The layers 39 and thermocouples of thermal energy 36 are made as layers 2 of thermocouples generating electricity 3 and on the same substrate 27. Circuits 35 thermocouples of thermal energy 36 of layers 39 by commutation buses 40 and cables 12 and 14 are connected by means of the unit 9 with storage batteries 11 (FIG. 1). Circuits 28 of thermocouples generating electric power 3 of each layer 2 are connected by commutation buses 41 and cables 12 and 13 with unit 9 and inverter 10. Layers 2 of thermocouples generating electric power 3 can be connected in series, parallel or combined.

When layers 2 and 39 are superimposed on each other, the arrangement of hot 31 and cold 32 zones of thermocouples generating electricity 3 and hot 37 and cold 38 junctions of thermocouples of thermal energy 36 coincide.

Parallel strips 22 of the receiver 21 have the possibility of contact in the area of hot zones 31 of the upper layer 2 through parallel slots 16 in a strong dielectric material 15, and parallel thin ribs 25—the possibility of contact in the area of cold zones 32 of the lower layer 2 through parallel slots 18 in a strong dielectric material 17 (FIG. 2,3,4,5).

One of the strips 22 has a temperature sensor 42 connected to unit 9 (FIG. 2).

TEG works as follows.

The TEG is provided with an electric energy storage device (for example, a battery) 11, which contributes to the accumulation of a part of the energy with a stable supply of thermal energy to the TEG during a favorable period of its operation. In an unfavorable period of TEG operation in case of insufficient sunlight or a change in the operating mode of external heat sources, when the temperature according to the readings of the temperature sensor 42 is below a certain value, the control and distribution unit 9 issues a command to switch the operation of layers 39 the thermocouples of thermal energy 36 to the power generation mode, to compensate for the change in temperature from heat sources.

TEG operates in the mode of converting thermal energy into electrical energy. Layers 39 of thermocouples of thermal energy 36 are placed between layers 2 of thermocouples generating electricity 3. In this case, the same-named junctions 29 and 30 of thermocouple circuits generating electricity 3 adjacent rows on each layer 2 are facing each other and form alternating rows of narrow zones of hot 31 and cold 32 junctions 29 and 30 (FIG. 10). Hot 37 and cold 38 junctions of each layer 39 thermocouples of thermal energy 36, which are located between the layers 2 of thermocouples 3, respectively, coincide with their hot 31 and cold 32 zones. All thermocouple layers are tightly superimposed on each other, herefore, in the mode of converting thermal energy of thermocouples into electrical energy, hot junctions 37 of thermocouples of thermal energy 36, which are located in the area of hot zones 31 of thermocouples 3, are heated, and cold junctions 38, which are located in the area of cold zones 32, are cooled (FIG. 4. 5, 6). When the circuits 35 the thermocouples of thermal energy 36 are connected to an external constant current source (taking into account the polarity of their connection to the source), hot junctions 37 in the area of hot zones 31 of thermocouples 3 are heated, and cold junctions 38 in the area of cold zones 32 are cooled according to the Peltier effect. The heat removal from the junctions 38 is also facilitated by the ribs 25 of the heat removal circuit 8, which are in close contact with the substrate 27 of the layer 2 in the area of the cold zones 32. The intimate contact of the ribs 25 with the substrate 27 through the slots 18 in the strong dielectric material 17 is provided by a rotation mechanism (not shown) of the rod 24. The temperature difference between the junctions of thermocouples of thermal energy 36 can reach 150° C. The number of layers 39 of thermocouples of thermal energy 36 placed between the layers 2 of thermocouples generating electricity 3 may be used more than one layer. Since all thermocouple layers are tightly superimposed on each other, the heat from hot junctions 37 of thermocouples of thermal energy 36 through contact of junctions with substrates and cooling from cold junctions 38 of thermocouples of thermal energy 36 is transferred, respectively, to all hot 31 and cold 32 zones of all layers 2 of thermocouples 3 by thermal conductivity. Due to the temperature difference in the junctions 29 and 30 of each thermocouple 3, a thermo-electromotive force is generated, and when the thermocouples are closed in series, an electric current is generated.

It is important to note that the heating and cooling of junctions 37 and 38 of thermocouples of thermal energy 36 (Peltier effect) is carried out not only in one layer (layers) of 39 thermocouples of thermal energy 36, but in all junctions 29 and 30 and substrates 27 of layers 2 of thermocouples 3, respectively in the area of hot 31 and cold 32 zones by thermal conduction due to their tight contact.

Taking into account some heat losses during transmission by thermal conduction to all layers of thermocouples 3, the temperature difference between junctions 29 and 30 in circuits 28 of each layer 2 is provided quite high and amounts to about a hundred degrees Celsius. Thermo-electromotive force depends on the temperature difference between the thermocouple junctions: the larger the difference, the greater the thermo-electromotive force. Due to the large temperature difference between the junctions of thermocouples 3, which is provided by heating and cooling the junctions of thermocouples of thermal energy 36, a high thermo-electromotive force is generated in the circuits 28 of thermocouples 3. Circuits 35 of thermocouples of thermal energy 36 are connected to a direct current source 11, for example, a storage battery. Periodically, the batteries are charged with a part of the generated electrical energy of the generator or in the TEG operating mode using solar energy due to the electrical energy generated by thermocouples of thermal energy 36, which in this mode are used as thermocouples to generate electrical energy by the unit 9.

Thermocouples are performed by one of the following methods: sputtering, spraying, heterostructure, etc. Moreover, the methods make it possible to obtain the sizes of thermocouples also on a nanometric scale.

For the substrate 27, dielectric heat-conducting materials are used that operate in a wide temperature range in the form of a thin film or facilitate their manufacture by sputtering, spraying, etc. The unit 9 provides control of the operating mode of the generator, charging the storage batteries 11, transferring the operation of thermocouples of thermal energy 36 to various modes, switching the layers of thermocouples for generating electricity 3 and thermal energy 36 in series, parallel or combined, processing data from the temperature sensor 42 and the temperature sensor placed between the layers of generating thermocouples (not shown), the connection of the inverter 10, etc. Inverter 10 is used to convert DC to AC.

The TEG operates in a solar energy mode. Stack 1 of TEG, installed in frame 4, which is connected by hinge 5 to support 6, with its upper plane oriented towards the sun (FIG. 1,2,3). The stack 1 is rigidly connected to the body 20 of the solar collector 19, made in the form of a parabolic mirror tray, which concentrates the sunlight on the focal line of the collector, and the solar collector 19 is also oriented towards the sun. The solar collector 19 can be made of polished sheet material (for example, stainless steel) and its profile is formed in any geometric shape that provides the maximum concentration of sunlight. In this case, the metal receiver 21, located along the focal line of the collector 19, heats up (FIG. 4). Heated and metal strips 22 parallel to each other in one plane, which are made as one piece with the receiver 21 (for example, welding). The strips 22 are in contact with the substrate protecting the top layer 2 of thermocouples generating electricity 3 in the area of hot zones 31 between rows of adjacent circuits 28 along their entire length. And the ribs 25 of the heat removal circuit 8, which are parallel to each other in the same plane and as one piece with the rod 24 (for example, by welding), are in contact with the substrate 27 of the lower layer 2 of thermocouples generating electricity 3 in the area of cold zones 32 between adjacent rows along their entire length (FIG. 5).

The metal receiver 21, located along the focal line of the collector 19, is heated by the focused sunlight. The heating temperature of the receiver 21 can reach 330° C., respectively, parallel metal strips 22 are heated (FIG. 4). The heated strips 22, which are in contact with the protective substrate, transfer heat to the hot junctions 29 of adjacent circuits 28 by conduction due to the tight contact of the substrate 27 of the junctions 29 of all layers 2 with each other. All thermocouple layers are superimposed tightly on top of each other and are closed from the outside with durable dielectric materials 15 and 17. Junction 29 of thermocouples generating electricity 3 in hot zones 31 of all layers 2 are heated by thermal conduction. In the cold zones 32, the junctions of 30 thermocouples 3 of all layers 2 are in close contact with each other and with the substrates 2 and, accordingly, with thin ribs 25, in close contact with the substrate of the lower layer 2. Heat transfer from the areas of cold zones 32 junctions 30 between the rows of circuits 28 of all layers 2 into the environment is carried out due to thin ribs 25 by thermal conduction and convection. Since the opposite junctions 29 and 30 of the thermocouple 3 are respectively in the heating zones 31 and cooling 32, a thermo-electromotive force is generated. All thermocouples 3 are connected in series in electrical circuits and when the circuits are closed, a constant electric current arises.

It is important that the heat flux is transferred not only by conduction to all junctions 29 of all layers in the hot zones 31 between the rows of the thermocouple 3 circuits 28, but also in the plane of each layer 2 due to the thermal conductivity legs of the thermocouples 3 to the junctions 30 in the cold zones 32. The junctions 29 in the thermocouple circuits 3 of adjacent rows, which face each other on each layer 2, are located in the hot zones 31, i.e. are heated, and the opposite junctions 30 of the same thermocouple circuits are cooled in the cold zones 32. Due to the temperature difference in the heating and cooling zones, in which there are respectively junctions 29 and 30 of thermocouples 3, a thermo-electromotive force is generated in these thermocouples according to the Seebeck effect. Thermocouples generating electricity 3 are connected in series in electrical circuits, when the circuits are closed, a constant electric current occurs. The efficiency of conversion of thermal energy into electrical energy for thermocouples made of dissimilar metals is several times less than the efficiency of thermocouples made of semiconductor materials; therefore, thermocouples made of semiconductor materials can be used in the generator. Depending on the requirement, the thermocouple layers are connected in series, in parallel or in combination.

The TEG stack 1 and the solar collector 19 rigidly connected to it are periodically oriented towards the sun by a rotating mechanism (not shown) in order to ensure the maximum flow of sunlight falling on the collector and the maximum heating of the receiver 21. Due to the connection of the frame 4 with the support 6 by means of the hinge 5 (FIG. 1), possibly uniaxial in one plane or biaxial orientation of the collector in two planes due to the rotation mechanism. To protect against atmospheric precipitation, the stack 1 of layers 2 thermocouples and the solar collector 19 are equipped with covers, and the collector cover is made of glass.

In the absence of sunlight, the rotation mechanism (not shown) of the stack 1 (collector 19) brings the stack 1 to its original position, and the rotation mechanism (not shown) of the receiver 21 and strips 22, made one with the receiver 21, removes them from contact with the upper substrate, which means from hot zones 31 between junctions 29.

When heat transfer from the receiver 21 through the strips 22 provides sufficient heating of the junctions 29 in the hot zones 31 between the rows of thermocouple circuits 28 generating electricity 3. The heat removal ribs 25 promote heat transfer to the environment by heat conduction and free convection. Forced convection of heat removal from the ribs can be used by cooling them with a fan or system of water cooling.

Despite some heat losses during heat transfer from strips 22 to hot junctions 29 and further to cold junctions 30, the average temperature difference between hot 29 and cold 30 junctions is quite high: more than a hundred degrees Celsius. Thermo-electromotive force generated by thermocouples is directly proportional to the temperature difference between the junctions, so the efficiency of the generator's conversion of thermal energy into electrical energy will be significant.

The use of solar energy by the generator and the transfer of thermocouples of thermal energy to the mode of generating electrical energy allows saving energy from an external energy source and increases the total energy generated by the generator. This means that the use of heat supply and heat removal circuits contributes to additional generation of electricity and thereby increases the efficiency and reliability of the TEG.

Thus, supplying the TEG with a layer of thermocouples of thermal energy on a dielectric heat-conducting substrate, connected to an external current source, placing it between (multistage) layers of thermocouples generating electricity, facing the same-named junctions of two adjacent rows of thermocouples generating electricity to each other on each layer with the formation of alternating rows of zones hot and cold junctions, which are combined with hot and cold junctions of thermocouples of thermal energy due to the repeatability of their rows of circuits, two times less than the repeatability of the rows of circuits of thermocouples generating electricity allow to ensure a high temperature difference between the junctions not only in the layer, but in all layers due to the tight contact of the junctions and substrates. A large temperature difference between the junctions also provides a large thermo-electromotive force, which means an increase in the efficiency and reliability of the TEG, regardless of the external heat source and weather conditions.

Providing heat supply to the hot junctions of thermocouples generating electricity due to metal strips made entirely with the solar collector receiver and removing heat by ribs into the environment allows saving energy of an external energy source and additional generation of TEG electricity, which more increases the efficiency and reliability of the TEG.

The invention claimed is:

1. A thermoelectric generator comprising:
a frame;
a plurality of superimposed thin-film layers, wherein each layer has a substrate and flat electricity generating thermocouples, wherein the flat electricity generating thermocouples are connected in series in electric circuits forming uniform and parallel rows, wherein the flat electricity generating thermocouples have alternating hot junctions and cold junctions creating alternating hot zones and cold zones;
at least one thermal energy layer comprising a substrate, an external current source, and flat thermal energy thermocouples, wherein the flat thermal energy thermocouples are connected in series in electrical circuits forming uniform and parallel rows, wherein the at least one thermal energy layer is between the flat electricity generating thermocouples, wherein the interval between adjacent rows of electrical circuits of the electricity generating thermocouples is at least two times less than the interval between the adjacent rows of electrical circuits of the thermal energy thermocouples, wherein the substrate of the thermal energy layer is made of a dielectric heat-conducting material, wherein the thermal energy electrical circuits are connected to the external current source, wherein the thermal energy thermocouples have alternating hot junctions and cold junctions creating alternating hot zones and cold zones, wherein the electricity generating thermocouple hot zones coincide with the thermal energy thermocouple hot zones and the electricity generating thermocouple cold zones coincide with the thermal energy thermocouple cold zones;
external heat supplying circuits;
heat removing circuits the external heat supplying circuits and the heat removing circuits rigidly connected to the frame;
a longitudinally placed solar collector in the form of a parabolic mirror tray to concentrate sunlight, and
a rod-shaped metal receiver movably attached longitudinally along a focal line of the solar collector and connected to metal strips parallel to each other in one plane, wherein, upon rotation of the rod-shaped metal receiver, the metal strips are adapted to contact the outermost thin-film layer substrate along a row of the electrical circuits in the hot junctions of the electricity generating thermocouples, wherein the heat removing circuit is metal ribs parallel to each other in one plane rigidly connected to a longitudinal rod, which is located along a side of the frame and is movably attached to the solar collector, wherein, upon rotation of the longitudinal rod, the metal ribs are adapted to contact the outermost thin-film layer substrate along a row of the electrical circuits in the cold junctions of the electricity generating thermocouples.

2. The thermoelectric generator according to claim 1, characterized in that the thermocouples are made by methods chosen from the group consisting of sputtering, spraying, and heterostructures, wherein the thermocouples are on a nanometer scale.

3. The thermoelectric generator according to claim 1, wherein the hot and cold junctions of the electricity generating thermocouples and the hot and cold junctions of the thermal energy thermocouples overlap in order to increase the area of surface contact in the places of contact transitions.

4. The thermoelectric generator according to claim 1, characterized in that the thermocouples are made of semiconductor materials.

5. The thermoelectric generator according to claim 1, further comprising a control and distribution unit.

6. The thermoelectric generator according to claim 5, wherein electrical circuits of the electricity generating thermocouples are electrically connected by respective switching buses and the switching buses are connected by cable to the control and distribution unit.

7. The thermoelectric generator according to claim 1, characterized in that a storage battery is used as a current source.

8. The thermoelectric generator according to claim 1, wherein the substrates provide dielectric and thermal conductivity over a wide range of temperatures.

9. The thermoelectric generator according to claim 1, wherein a temperature sensor is on the metal strips connected to the control and distribution unit.

10. The thermoelectric generator according to claim 1, further comprising upper and lower flat plates, which are applied, respectively, to the outermost substrate of the upper layer and the lower substrate of the lower layer of said thermocouples generating electricity to ensure thermal contact between said layers in said package, and are made of a dielectric material, and on said outer upper part there are parallel slots, evenly placed among themselves, corresponding to the length of said rows of electrical circuits in the areas of said hot junctions of said thermocouples generating electricity for said parallel metal strips and on said outer lower part there are also parallel slots, evenly placed among themselves, corresponding to the length of said rows of electrical circuits in the areas of said cold junctions of said thermocouples generating electricity for said parallel metal fins.

11. The thermoelectric generator according to claim 1, characterized in that the solar collector is made of polished sheet metal material.

12. The thermoelectric generator according to claim 1, wherein the solar collector has a geometric profile in order to maximize concentration of sunlight along its focal line.

13. The thermoelectric generator according to claim 1, wherein cooling of the ribs of the heat removing circuit is forced by a fan.

14. The thermoelectric generator according to claim 1, wherein the frame is rigidly connected to the collector, and further comprising a biaxial mechanism for sun orientation of the solar collector.

15. The thermoelectric generator according to claim 1, further comprising a common mechanism for turning the metal receiver rigidly connected to parallel metal strips and the longitudinal rod rigidly connected to parallel metal ribs around their axes.

16. The thermoelectric generator according to claim 1, characterized in that the generator is equipped with an inverter.

17. The thermoelectric generator according to claim 1, wherein the storage battery is periodically charged with a part of the output energy of the generator.

18. The thermoelectric generator according to claim 1, further comprising glass covers covering the layers and the solar collector.

* * * * *